United States Patent [19]

Toman et al.

[11] Patent Number: 4,662,066

[45] Date of Patent: May 5, 1987

[54] CONTINUOUSLY OPERABLE TOOL FOR USE IN PRODUCTION LINE PROCESS

[76] Inventors: Herbert Toman, Marcomannen Strasse 15/6/2/6, A1220 Vienna; Friedrich Kopecky, Baumgarten Strasse 89/, A-1140 Vienna, both of Austria

[21] Appl. No.: 792,118

[22] Filed: Oct. 28, 1985

[51] Int. Cl.[4] ............................................. H01R 43/00
[52] U.S. Cl. .................................. 29/854; 29/25.42; 29/564.6
[58] Field of Search .................... 29/705, 25.42, 564.6, 29/846; 140/71 R, 105

[56] References Cited

U.S. PATENT DOCUMENTS

| | | | |
|---|---|---|---|
| 3,073,007 | 1/1963 | Rubinstein et al. | 29/25.42 |
| 3,079,957 | 3/1963 | Weiss | 29/25.42 X |
| 3,080,908 | 3/1963 | Weiss | 29/25.42 X |
| 3,091,835 | 6/1963 | Weiss | 29/25.42 |
| 3,315,331 | 4/1967 | Weiss | 29/25.42 |
| 3,394,441 | 7/1968 | Weiss | 29/25.42 |
| 4,192,061 | 3/1980 | Masuzima et al. | 29/564.6 X |
| 4,341,013 | 7/1980 | Haldinger | 29/25.42 X |

FOREIGN PATENT DOCUMENTS

| | | | |
|---|---|---|---|
| 687166 | 5/1964 | Canada | 29/25.42 |
| 47-6170 | of 1972 | Japan | 29/25.42 |

Primary Examiner—Howard N. Goldberg
Assistant Examiner—Carl J. Arbes
Attorney, Agent, or Firm—Brown, Martin, Haller & Meador

[57] ABSTRACT

The present invention relates to a continuously operable tool for use in a production line process, and to a process using one or more such tools. The tool is capable of handling a plurality of workpieces simultaneously and comprises a rotatable assembly such as a drum having a series of workpiece handling stations spaced around its periphery. Workpieces are picked up one by one on the drum as each handling station passes a pick-up point during each revolution of the drum. Each workpiece is carried round on the drum until it reaches an exit point, where it is transported away from the drum. Each workpiece handling station includes at least one workpiece manipulation device which reciprocates back and forth between an inoperative position and an operative position in which it operatively engages a workpiece at the station between the pick-up point and the exit point.

28 Claims, 18 Drawing Figures

CONTINUOUSLY OPERABLE TOOL FOR USE IN PRODUCTION LINE PROCESS

BACKGROUND OF THE INVENTION

The present invention relates to a continuously operable tool for use in a production line process in which a plurality of workpieces are fed one by one to the tool, handled or manipulated by the tool, and exit from the tool to proceed to a subsequent stage in the process.

In many production line processes it is necessary to repeatedly stop and start the workpiece transport mechanism while workpieces at various stages in the process are manipulated by appropriate tools. This slows down the process significantly and the intermittent operation reduces parts lifetime and increases the risk of breakdowns.

In the manufacture of electronic components, for example, leads are still often soldered to components by hand because of the complexity necessary in a machine or process for carrying out the operation automatically. In one known component assembly machine lengths of wire are formed into U-shaped loops one by one at a first station, attached to a carrier strip, and carried by the strip to another station where components are fed into the loops. At another stage in the process the components are soldered to the loops. The carrier strip must be stopped and re-started repeatedly at a very high rate to accommodate the reciprocating motion relative to the workpieces as various operations are carried out. This causes vibration which may cause chips to be shaken out of the wire loops.

SUMMARY OF THE INVENTION

According to one aspect of the present invention a continuously operable tool for handling a plurality of workpieces simultaneously is provided. The tool comprises a rotatable assembly with a series of workpiece handling stations spaced around the periphery of the assembly. At least one workpiece manipulating device is associated with each workpiece handling station, and is movable back and forth between an inoperative position and an operative position in which it operatively engages the workpiece. A mechanism is provided for reciprocating the manipulating devices back and forth as the assembly rotates, so that each manipulating device reciprocates back and forth at least once during each full rotation of the assembly. In a continuous process the rotatable assembly will be located so that at least part of its rotating path lies in the path of workpieces through the process.

Workpieces are picked up one by one during rotation of the assembly as each handling station passes a pick up point in the path, and the picked up workpieces are carried around by the assembly to an exit point where they are transported away from the assembly to continue along the process path, while the now empty handling stations leaving the exit point back to the pick up point to pick up new workpieces. Each manipulating device is urged into its operative position between the pick up point and exit point, so that manipulation of the workpiece at each station is complete by the time that station reaches the exit point.

In a preferred embodiment of the invention the rotatable assembly comprises a drum with workpiece handling stations provided at spaced intervals around the outer periphery of the drum. The manipulating devices may be urged radially in and out from the outer periphery of the drum, or axially across the outer periphery of the drum, for example by stationary cam surfaces either inside or alongside the drum. They may be designed to shape or bend workpieces, for example, or to insert items or attach items to a workpiece.

The manipulating devices are preferably actuated by a suitably shaped stationary cam surface as the drum rotates so that they are forced back and forth by the shape of the surface. A spring or bearing may be provided for returning the devices to an inoperative position, or the cam surface may be in the form of a track or rail in which the workpieces run. Alternatively, oppositely directed advance and return cam surfaces may be provided.

Two or more cooperating manipulating devices may be provided at each station, for example one which moves radially in and out while the other slides axially back and forth across the drum outer circumference.

In one specific embodiment of the invention a wire bending or forming tool is provided, in which the manipulating devices at each station comprise a radially movable anvil device and an axially movable slider device. The slider device has a cut out conforming to the shape of the anvil and the shape into which a length of wire is to be bent. A wire feeding device is provided for feeding successive cut lengths of wire into a space between the anvil device and slider device at each successive handling station as it passes the pick up point. As the picked up wires leave the pick up point the slider device starts to slide across the outer circumference of the drum to trap the wire between its cut out and the anvil device, which is already in its operative position.

Preferably a carrier strip is carried around by the drum and the free ends of the bent wires are secured to the carrier strip, for example by means of an adhesive tape, before the exit point is reached. The slider device is withdrawn to the inoperative position and the bent loops of wire at successive stations reaching the exit point are carried away to a next processing station on the carrier strip.

Thus at any one point a series of lengths of wire are at various stages of being bent into a predetermined shape at successive stations between the pick up point and exit point on the drum. This was not possible previously because of interference between successive lengths of wire when the wires were carried in a linear path.

Preferably the co-operating cut-out and anvil device are shaped to form wires into loops which are narrower at their loop end than at their free ends secured to the carrier strip.

Such a tool may be used, for example, as part of a continuous process for securing leads to electronic components. Another continuously operable tool according to the invention may be used at a later state in the process to feed components into the gaps at the narrow ends of the loops of wire. Thus, according to another aspect of the present invention, a component feeding tool is provided for inserting components into successive loops of wire. The manipulating devices at each handling station comprise sliders which reciprocate axially across the outer surface of the drum, the sliders having indents for carrying components fed into the indents by a component feed device at the pick-up point. The loops of wire are preferably carried around the drum between the pick-up point and exit point by the carrier strip such that the loop of wire at each station is positioned above and in alignment with the slider device. The indent in each slider device is designed such that the carried component projects upwardly out of it and as the slider moves across the drum into the operative position the component is moved into the narrower end of the loop of wire at that station, the dimensions of the narrow end of the loop being such that the component is gripped between the opposite arms of the loop. When the loop of wire is carried away on the carrier strip at the exit point, the component will be carried with it.

According to another aspect of the present invention a continuous process for securing leads to electronic components is provided. One or more tools comprising rotatable assemblies are provided with at least part of their paths of rotation lying in the path of workpieces through various stages in the process. In a preferred embodiment of the invention the process includes the steps of supplying a carrier strip having punched holes along its length to a wire forming tool as described above, the strip being carried around with the drum between the pick up point and exit point by means of indexing pins on the drum, supplying successive lengths of cut wire to successive handling stations on the drum as they pass the pick up point, bending the lengths of wire to form loops which are narrower at their inner end than their free ends, securing the free ends of each loop to the carrier strip, transporting the carrier strip and carried loops of wire away from the wire forming tool at the exit point, transporting the loops of wire to a component feeding tool as described above, feeding components into the narrow ends of each loop of wire at successive handling stations on the component feeding tool between its pick up and exit points, transporting loops of wire with inserted components from the feeding tool exit point to a soldering assembly, soldering components to the wire loops of successive loops of wire passing through the soldering assembly, and cutting off the projecting loop ends of the wire loop to form separate leads secured to the components. Alternatively, the loop ends may be cut off prior to chip insertion to avoid having any ends protruding beyond the component.

This continuous lead securing process can operate at a significantly faster rate and improved reliability to similar, non-continuous processes. The continuously operable tools which can handle a plurality of wires, wire loops, and components simultaneously increase operating efficiency significantly.

BRIEF DESCRIPTION OF THE DRAWINGS

The above and other features of the present invention will be more clear from the following detailed description of a preferred embodiment of the invention, taken in conjunction with the accompanying drawings, in which like reference numerals refer to like parts and in which.

DESCRIPTION OF THE PREFERRED EMBODIMENT

In the preferred embodiment of the present invention shown in the drawings continuously operable tools according to the invention are used in a continuous process for forming the wire leads of electronic components and securing the leads to the components. However this is only one specific example of many possible applications of continuously operable tools according to the invention, which may be used in any operation where it is desirable to handle a plurality of workpieces simultaneously while a specific operation is being carried out, the successive workpieces being in successive stage of completion of the desired operation.

Figure 1:
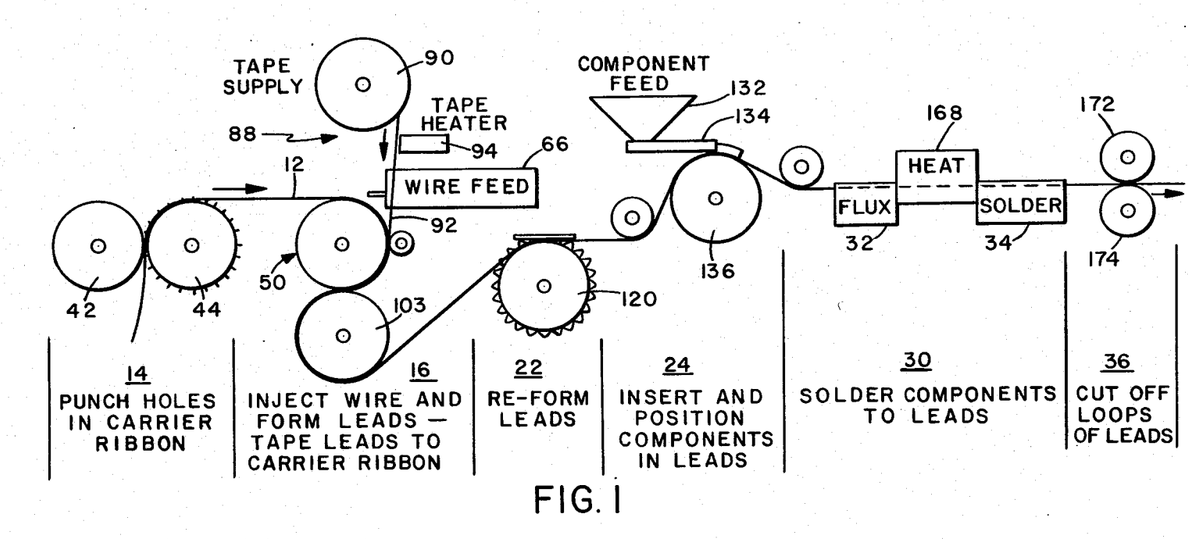
FIG. 1 illustrates a continuously operable wire lead forming and component assembly machine according to a preferred embodiment of the present invention schematically in stages.
Figure 2:
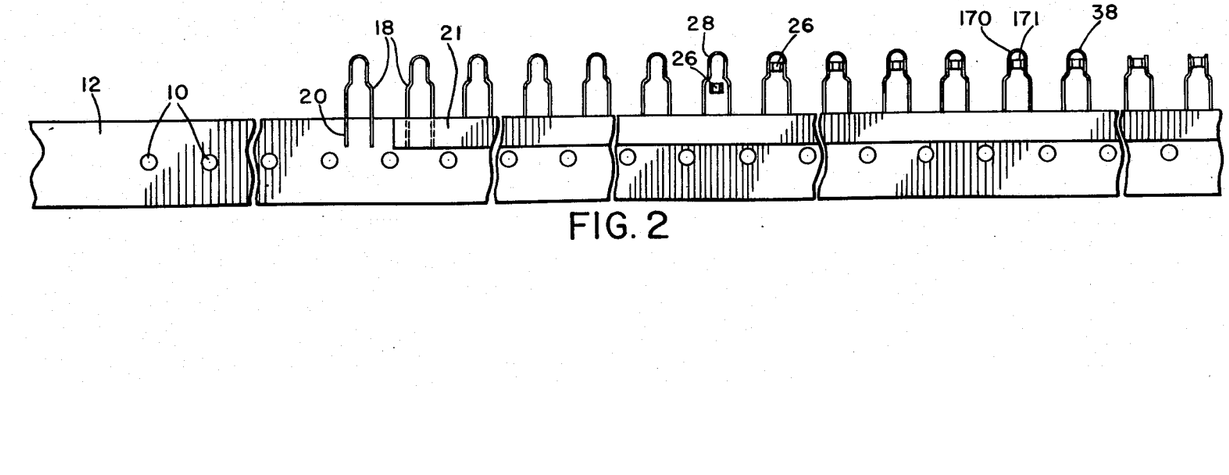
FIG. 2 illustrates a component strip with progressive steps corresponding to the stages of FIG. 1.

FIGS. 1 and 2 of the drawings show the various stages in a machine for carrying out a wire lead forming and securing process according to one possible embodiment of the present invention. This process forms one preferred embodiment of a process involving continuously operable tools according to other embodiments of the present invention. The various components of the machine at successive stages in the process are suitably mounted on a support frame 200 or other mounting assembly as indicated schematically in the drawings.

The basic steps in the operation include punching a series of indexing holes 10 in a carrier strip or ribbon 12 at a first stage 14 in the process. The carrier strip is suitably of cardboard or similar material of sufficient flexibility to be transported along the indicated path through the various stages in the process. The indexing holes are used in transporting the strip along the indicated path and maintaining it in the correct location relative to the various tools as it passes through the various stages of the process.

At the second stage 16 successive cut lengths of wire are bent to form loops 18 and secured at their free ends 20 to the punched carrier strip. The holes 10 in the carrier strip cooperate with pins at various transporting mechanisms throughout the operation so that the strip follows the predetermined path indicated in FIG. 1 through the machine.

At the third stage 22 the leads are reformed to shape the loops more accurately, and the shaped leads are then carried on the carrier strip to the fourth stage 24 where components 26 are fed into the successive loops so that they are gripped between the opposite arms of each loop at its narrower end 28. The loops carrying components are then transported to the soldering stage 30, where they are passed through flux 32, heated and then passed through a solder wave at 34 to secure the components to the opposite arms of each loop. At the next stage 36 the projecting end 38 of each loop is cut off to separate the leads, and the carrier tape carrying the finished components can then be tensioned and wound onto a storage reel, subsequent to an optional gross testing stage described below in connection with FIG. 18.

The various stages in the process and machine components for carrying out the various steps will now be described in more detail.

Figure 3:
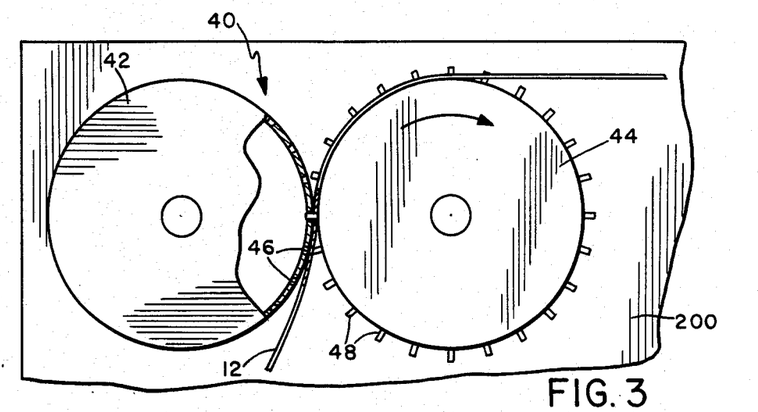
FIG. 3 is a front elevation view showing the punching stage of the component carrier strip.

FIG. 3 of the drawings illustrates a hole punching apparatus 40 utilized in the first stage 14 of the process. A continuous length of carrier strip 12 is fed from a suitable supply roll (not shown) to the apparatus 40, where it is passed between two commonly driven rollers 42 and 44 which are rotatably mounted on frame 200 with their axes parallel. The roller 42 has a series of holes 46 spaced around its periphery, while the roller 44 has a series of radially projecting pins 48 at equivalent spacings which cooperate with roller 42 to project into the holes 46 at the closest point between the rollers, where they are spaced apart by a distance approximately equal to the thickness of the carrier strip, as shown in FIG. 3. Thus the pins will pierce a series of spaced holes 10 in the strip 12 as it passes between the rollers, and the pierced strip is directed from the first stage of the process to the second stage 16 as indicated in FIG. 1.

In a specific example of the invention the carrier strip 40 was of approximately 18 mm width and a thickness of 0.5 mm, and the indexing holes were of approximately 4 mm diameter at a spacing of about 1.26 cm. However these dimensions may be varied according to the specific application and the required spacing between units to be secured to the carrier strip.

Figure 4:
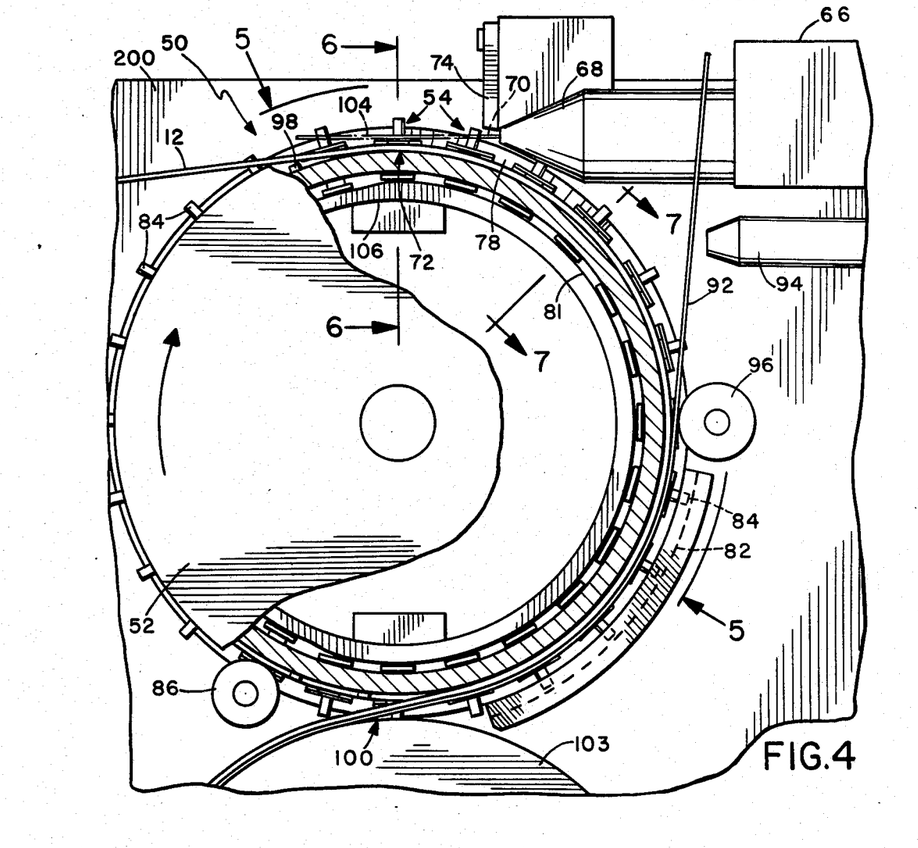
FIG. 4 is a front elevation view, partially cut away, of a tool according to a preferred embodiment of the invention which forms the wire lead forming and taping stage.
Figure 5:
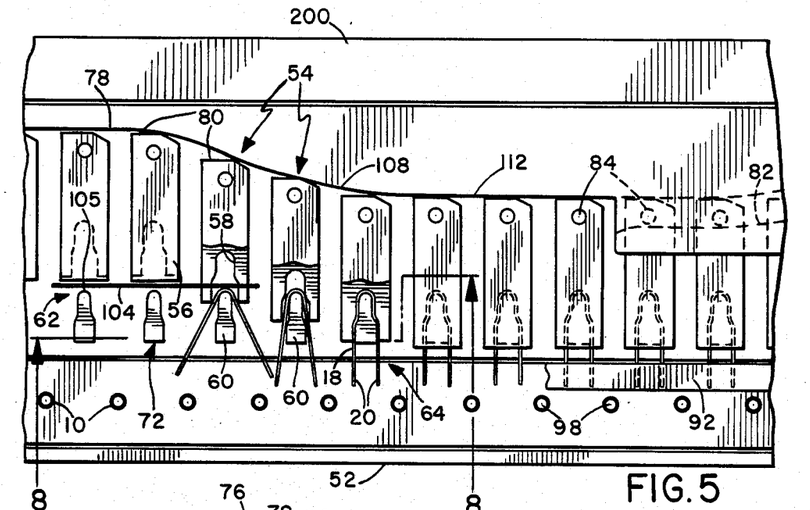
FIG. 5 is a view taken on curved line 5—5 of FIG. 4.
Figure 6:
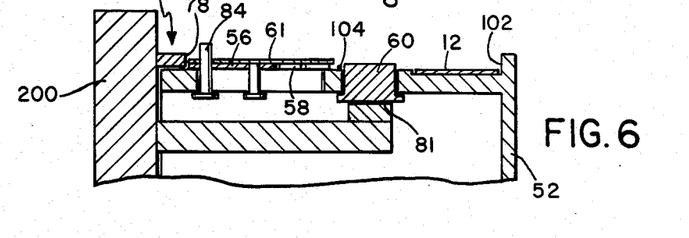
FIG. 6 is a sectional view taken on line 6—6 of FIG. 4.
Figure 7:
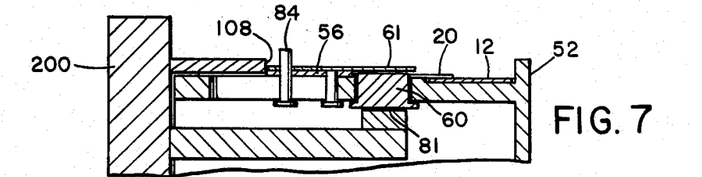
FIG. 7 is a sectional view taken on line 7—7 of FIG. 4.

The second stage of the process comprises a wire forming tool or apparatus 50 which is shown in detail in FIGS. 4 to 8. The apparatus 50 is a continuously operable tool comprising a rotatable assembly lying with at least part of its path of rotation in the path of the carrier strip. The assembly basically comprises a rotating drum 52 mounted on the frame 200 and having a series of wire forming stations 54 spaced around its periphery. In the preferred embodiment thirty wire forming stations 54 are provided at equal spacings around the periphery of the drum. Each wire forming station includes a forming die or slider 54 having a shaped cut out or indent 58, and an anvil device 60 of outline corresponding in shape to the cut out 58, as best shown in FIG. 5. The slider has a tongue or lip 61 which projects forwardly over the cut-out as shown in FIGS. 6 and 7. A suitable drive assembly (not shown) is provided for rotating the drum 52.

The forming die is mounted to slide back and forth axially across the outer surface of the drum, while the anvil device is mounted to move radially in and out between an inoperative position and an operative position. In the inoperative position 62 shown at the left hand end of FIG. 5, the forming die and anvil device are spaced apart to leave a gap 105 and the anvil device is retracted within the drum, and in the operative position 64 the anvil device projects out of the outer surface of the drum and is engaged within the cut-out 58 in the advanced forming die.

The wire forming apparatus also includes a wire feeding assembly 66 including a wire feeder 68 for feeding wire 70 in the direction of a pick-up point 72 at or adjacent the uppermost or 12 o'clock position on the drum's periphery, and a cutter 74 for cutting the wire to a predetermined length. The wire feeding assembly is of a conventional type and also includes a wire tensioner and straightener (not shown in the drawings) and an optional wire oiler or cleaner. The wire itself may be of copper coated steel, for example, or other wire material suitable for forming the leads of electronic components.

Figure 8:
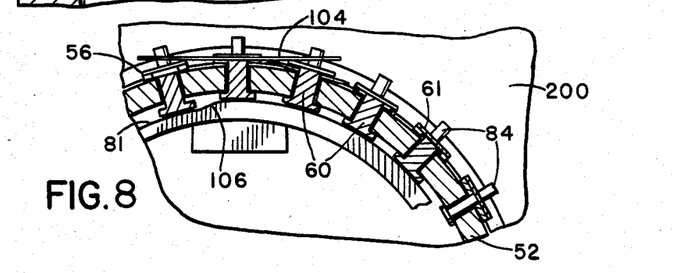
FIG. 8 is a sectional view taken on staggered line 8—8 of FIG. 5.

An actuating assembly 76 is also provided for reciprocating the forming die and anvil device at the various forming stations between their operative and inoperative positions. The actuating assembly comprises a first stationary cam surface 78 positioned adjacent the peripheral edge of the drum around at least part of its circumference for engaging the outer ends 80 of the forming dies as shown in FIGS. 5 to 7. A second stationary cam surface 81 is positioned within the drum as shown in FIG. 8 for engaging the inner ends of the anvil devices as they rotate with the drum. The first cam surface 78 includes a retracting slot 82 for engaging retracting pins 84 projecting upwardly from the forming dies as they rotate past the three o'clock position, as indicated in FIG. 4. A return roller or bearing 86 is rotatably mounted in contact with the outer surface of the drum at a position just past the six o'clock point to return the anvil devices to their inoperative position. The return roller may optionally be arranged to act on pins projecting from the wider end of each anvil device so that each anvil device is actually recessed slightly within the drum's surface in the inoperative position.

Also provided at the wire forming stage is a tape feeding assembly 88, as indicated in FIG. 1, which comprises a supply 90 of adhesive tape 92, and a tape heater 94. The adhesive tape 92 is fed from the supply 90 past the heater 94 to the drum, where it is urged with its adhesive face inwards against carrier strip 12 (see FIG. 4) by means of a silicon roller 96 bearing against the tape at the three o'clock position of the drum.

As can be seen in FIG. 4, the pierced carrier strip 12 travels from the first stage 14 to a position just before 12 o'clock on the drum 52, where a series of indexing pins 98 projecting from the periphery of the drum at spaced intervals corresponding to one or more times the spacing between spaced indexing holes on the strip 12 engage in successive holes in the strip as the drum rotates past the pick-up point 72 to carry the strip around the drum to an exit point 100. The carrier strip is carried in a recess 102 around the right hand half of the drum periphery, as shown in FIGS. 6 and 7. The strip is carried around the drum for approximately 200 degrees to the exit point 100, which is at or just after the lowermost or six o'clock position. At the exit point 100 the carrier strip is directed around a take off roller 103 which may be a simple plastic drum or may have radially projecting indexing pins (not shown) which engage the indexing holes in the strip as it travels around the roller. The take-off roller 103 is rotated by a common drive assembly in contact with the drum at approximately the six o'clock position. The carrier strip here makes a 180 degree turn around take-off roller 103 before proceeding to the next station. A suitable drive assembly (not shown in the drawings) is provided for rotating the drum and take off roller continuously.

As each wire forming station rotates past the pick-up point, the wire feeder will shoot a cut length of wire 104 (see FIGS. 4 and 5) transversely into the gap 105 between the forming die and anvil device, so that the wire is picked up or trapped in the gap and carried away as the drum continues to rotate. Just before the respective anvil device reaches the pick-up point, a radial step 106 in the outer periphery of the second cam surface will start to urge the anvil device outwardly to its operative position. As the respective station leaves the pick-up point, an outwardly curved portion 108 on the first cam surface curving towards the drum will cause the forming die at that station to start travelling across the outer surface of the drum to grip the length of wire between it and the corresponding projecting anvil device. As the forming die continues its travel to the operative position in which the anvil device is within the shaped cut-out 58, the wire will be bent between the opposed faces of the cut-out and anvil device to form a loop 18 of the shape shown in FIG. 5 having a narrower inner end portion 28. The projecting lip 61 above the cut-out will ensure even, flat forming of the opposite arms of each loop of wire and give the wire no chance to twist or warp out of the bending plane.

The first cam surface is shaped such that the forming die reaches its operative position between the twelve and three o'clock positions of the respective forming station. The bending will be completed approximately 30 degrees beyond the 12 o'clock position. A straight portion 112 of the cam surface then maintains the forming die in its operative position until the forming station reaches the retracting groove, to ensure that the wire shape is maintained until the free ends of the loop are taped to the carrier strip. This prevents spring action of the wire causing it to loose its shape.

The retracting groove 82 is shaped and positioned to engage the retracting pins of successive forming dies as they reach the groove, and to pull the forming dies back into the inoperative position to release the formed loops of wire. Thus each forming die is in the retracted, inoperative position just before its respective station reaches the exit point.

As can be seen in FIG. 5, the carrier strip is carried via indexing pins around the periphery of the drum adjacent the forming stations, such that when the successive lengths of wire are formed into loops their free ends 20 will lie over the adjacent edge of the strip 12. The adhesive tape 92 is urged by the roller 96 at the three o'clock position against the edge portion of the strip to secure the free ends of successive loops to the strip, so that when the forming die is retracted the secured loops are carried away from the drum by the carrier strip on the take off roller.

Thus successive lengths of wire are picked up at successive forming stations as they pass the pick up point, shaped into loops having narrowed end portions, and secured to a carrier strip to be carried away from the drum to the next stage in the process. At any one time a series of wire loops will be engaged at successive stations between the pick-up and exit points, and the wire forming process can proceed continuously with no need for intermittent operation. As can be seen in FIGS. 8 and 4, the spacing between adjacent stations on the drum is such that the successive cut lengths of wire directed to the pick-up point will not interfere with either the preceding or successive forming stations which will be positioned below the feed direction of wire feeder 68. Preferably, the respective forming station is about 2 to 3 degrees past the pick up point when the length of cut wire is shot into place. This prevents any possible interference with the wire being shot in and also allows the picked up wire to be cleared away quickly from the next wire coming in. At the same time the reciprocating movement of anvil devices 60 ensures that they are retracted until they reach the pick-up point so that the left hand end of the fed length of wire does not bump into the adjacent anvil device left of the pick-up point.

The wire feeder is timed and co-ordinated with the rotation of the drum 52 so as to fire a length of cut wire at the pick up point each time a forming station reaches the pick up point during rotation of the drum.

Although the rotatable assembly in the preferred embodiment of the tool described above is a cylindrical drum, it may comprise any suitable assembly having an outer peripheral surface or track which follows a closed path when the assembly is rotated. The outer peripheral surface is positioned to lie in the path of workpieces around at least part of its path of rotation between the pick up and exit point. For space conservation reasons the rotatable assembly is preferably shaped so that the handling or wire forming station at the pick up point at any one time is raised above both the preceeding and successive wire forming station on the assembly. Thus, where the rotating assembly is a drum, the pick up point is at or near the uppermost position on the drum.

Although stationary cam surfaces have been described as the actuating assemblies for urging the forming dies and associated anvil devices between their inoperative and operative positions, stationary cam tracks or rails may be provided in an alternative arrangement so that separate return devices such as the return groove and return roller are not required. Additionally the anvil devices need not be retracted but could remain continuously in their projecting, operative position, if the spacing between adjacent stations was sufficient to ensure that the cut length of wire fed to a station would not interfere with the preceeding or succeeding station.

Although the wire forming apparatus 50 has been described above as part of a continuous process for securing wire leads to electrical components, it will be understood that such a wire forming apparatus can be used in many alternative applications in which wires are to be bent into any chosen configuration, with suitable adjustment of the shapes of the cut-out 58 and anvil device 60.

As can be seen in FIGS. 2 and 5, the indexing pins 98 and forming stations 54 on the drum are positioned such that the successive formed and taped lengths of wire are positioned between adjacent indexing holes 10 of the carrier strip. In one specific example of the invention a spacing of the order of 1.25 cm between adjacent loops of wire was provided, but clearly alternative spacings may be provided for different applications according to the size of components to be secured to the carrier strip.

The continuously operable wire forming tool allows a plurality of lengths of cut wire to be handled simultaneously while they are being transported along a predetermined path. Thus the rate of wire forming can be increased significantly over an intermittently operated forming tool which is positioned at a single position in the workpiece path and only bends one wire at a time. This wire forming tool may therefore be of significant use in any wire forming operation, and not only in the forming of wire leads for electronic components.

Figure 9:
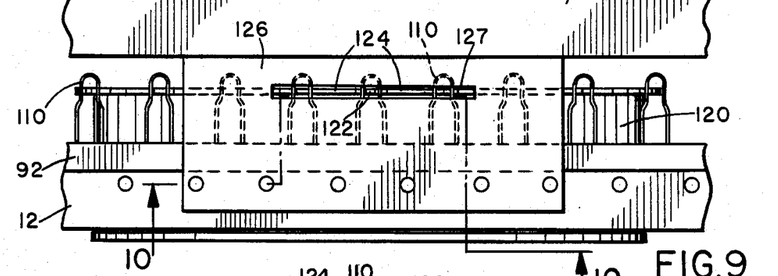
FIG. 9 is a top plan view of the lead re-forming stage.
Figure 10:
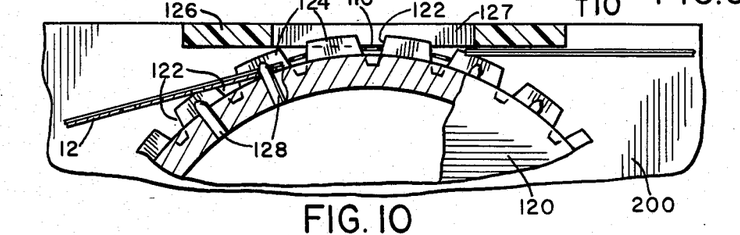
FIG. 10 is a sectional view taken on staggered line 10—10 of FIG. 9.

The third stage of the process comprises a wire lead re-forming apparatus as best shown in FIGS. 9 and 10. The apparatus comprises a rotating drum 120 mounted on frame 200 and having a series of spaced generally V-shaped indents 122 defined between projections 124 and a stationary pusher plate 126 positioned above the drum 120 and having a slot 127 into which successive projections project as the drum rotates past the plate 126. Again the drum will be rotated by a suitable drive assembly (not shown).

Spaced around the periphery of the drum are a series of indexing pins 128 positioned to engage in successive indexing holes in carrier strip 12 as it is fed onto the drum. The indexing pins are positioned to carry the strip 12 around the drum 120 with the narrow ends of the projecting loops of wire located in successive indents 122. The indents are of downwardly tapering width so that the pusher plate pushes the narrow end portions of the loops downwardly into the indents as shown in FIG. 9 to squeeze the opposite arms of the narrow end portions together. This ensures that the spacing between the arms of each loop of wire at the narrow end 28 is slightly less than the component or chip size, taking into account possible manufacturing variations. After the squeezing operation the strip carrying the reformed loops is directed to the fourth stage 24 of the process.

The fourth stage 24 of the process (see FIG. 1) comprises a component or chip insertion tool or apparatus 130 which is shown in more detail in FIGS. 11 to 15. The components 26, which may be any electronic components to which leads are to be applied, such as capacitors, transducers, resistors and the like, are supplied from a component feeder bowl 132, shown schematically in FIG. 1, via a linear vibrator 134 to the component insertion tool.

Figures 12, 13:
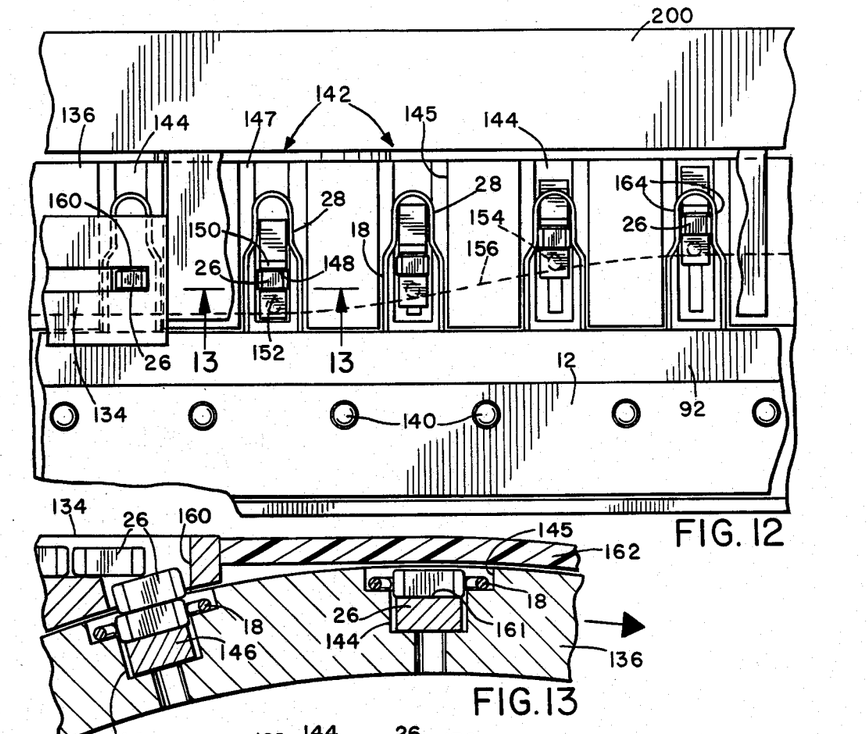
FIG. 12 is an enlarged view taken on curved line 12—12 of FIG. 11.
FIG. 13 is an enlarged sectional view taken on line 13—13 of FIG. 12.
Figure 14:
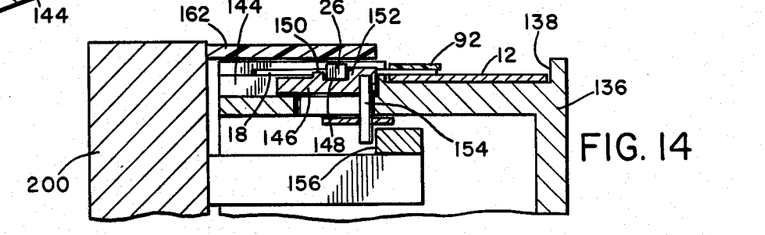
FIG. 14 is an enlarged sectional view taken on line 14—14 of FIG. 11.
Figure 15:
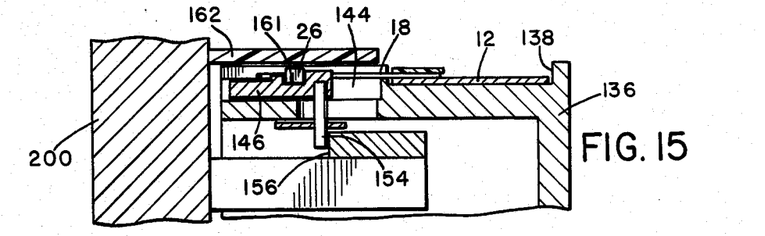
FIG. 15 is an enlarged sectional view taken on line 15—15 of FIG. 11.

The insertion tool or apparatus 130 basically comprises a rotatable assembly or drum 136 having an annular indent or groove 138 around the right hand half of its peripheral surface, as shown in FIGS. 12, 14 and 15, in which the carrier strip is guided from the point where it meets the drum to the exit point where it is guided away from the drum to the next stage of the process.

The groove 138 has a series of spaced radially projecting indexing pins 140 which cooperate with the carrier strip 12 in the same manner as the indexing pins on the wire forming drum 52 to carry the strip 12 in the desired path around part of the drum as it rotates.

The drum 136 has a series of spaced component insertion stations 142 spaced around its periphery. In a preferred embodiment of the invention thirty spaced stations are provided around the periphery of the drum, but a greater or lesser number may be provided in alternative applications. At each station the drum has an axially orientated groove 144 in which a component pick up and feed slider 146 is provided. Each slider is movable axially in its respective groove between the inoperative position shown in FIG. 14 and the operative position shown in FIG. 15. As shown in FIG. 13, each groove 144 is of stepped width, with a widened outer end portion 145 and opposed ledges or shoulders 147 on opposite sides of the groove between the wider portion and the narrower inner end portion in which the slider 146 rides.

The sliders are each of width slightly less than that of the average component 26 and each have an upwardly facing open sided component receiving pocket 148, as best shown in FIGS. 14 and 15. The pocket 148 is defined between two upward projections or shoulders 150, 152 which are spaced apart a sufficient distance to allow the average component to rest in the pocket as shown in FIGS. 12 and 14. The rearmost shoulder 152 is taller than the other shoulder and acts as a pusher.

As best shown in FIGS. 14 and 15, an actuating pin 154 projects downwardly from the inner or rear end of each slider 146. The actuating pins 154 cooperate with an actuating assembly comprising advance and return stationary cam surfaces 156 and 158 (see FIG. 11) within the drum for moving the sliders between the operative and inoperative positions as the drum rotates.

Figure 11:
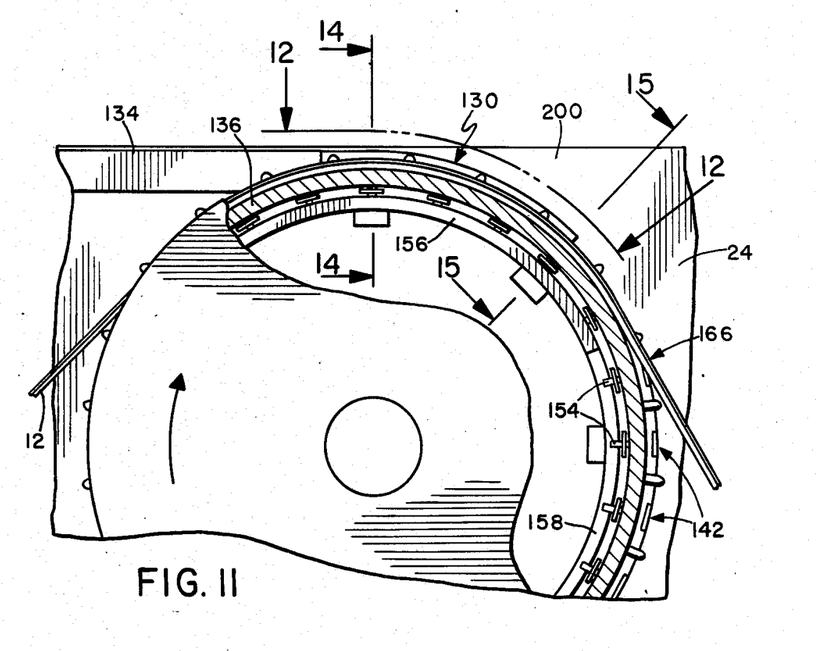
FIG. 11 is a front elevation view, partially cut away, of the component insertion stage of the machine.

The carrier strip 12 carrying the wire loops 110 meets the drum at approximately the 9 o'clock position, as shown in FIGS. 1 and 11, where it is picked up by engagement of the indexing pins 140 in holes 10 such that the wire loops project into widened upper end portions of the successive grooves 144 above the sliders 146 (see FIGS. 12 to 15). Thus the opposite arms of each loop rest on the opposed ledges or shoulders 147 of the respective groove on opposite sides of the slider. The width of the sliders is less than the loop gap at the wider end of the loop, so that each pusher shoulder 152 in the inoperative position of its slider will project upwardly between the opposite arms of each loop at its widest end as the loops are picked up at the pick up point on the drum in successive insertion stations as they rotate past the pick up point.

As shown in FIG. 13, the linear vibrator 134 comprises a linear track along which components are fed one by one to an outlet 160 which is located at or near to the uppermost or 12 o'clock point on the drum 136. Projecting forwardly from the outlet end of the track across the drum circumference is a cover or tongue member 162, which may be of plastic or other suitable material and which is machined to fit snugly against the outer surface of the drum above the axial grooves. The cover member 162 extends for approximately 20 degrees around the drum circumference from the component insertion point.

Components or chips sitting in the vibrator track will push forward one by one until they reach outlet 160, which is of dimensions slightly more than the average component dimensions. The forwardmost component will fall down into the outlet and sit there sliding against the outer surface of the drum until the next insertion station reaches the outlet 160 or pick up point. At this point the component will fall into the pocket 148 of the underlying slider, which is located in alignment with outlet 160 in the inoperative position of the slider as shown in FIG. 13. The slider carrying the component will then travel away from the outlet 160, and the next component will fall into the outlet to slide against the surface of the drum until the next slider arrives.

The successively picked up components are therefore retained in the pockets 148 between the opposite arms of the respective loop, with the cover member 162 counteracting any tendency of the component to rise up out of the respective pocket. The floor of each pocket is set so that a component in the pocket will meet the opposite leads or arms of the respective loop at a plane which approximately halves the component in two.

As the respective slider leaves the outlet or pick up point, the actuating pin 154 will travel against a curved actuating surface of the cam 156 as shown in FIG. 12 to urge the slider outwardly towards the advanced position shown in FIG. 15. The slider at the right hand end of the portion of the drum shown in FIG. 12 has just reached the advanced or operative position. As the slider moves the component is pushed by pusher shoulder 152 towards the narrow end 28 of the loop, where the spacing between the opposite arms or leads is less than the width of the component. When the component reaches the narrow end of the loop it will be resiliently gripped between the opposite arms or leads 164, and will be carried out of the slider and away from the drum as the carrier strip is guided tangentially away from the drum at the exit point 166. The carrier strip is carried around the drum for a little more than 90 degrees before being directed away from it towards the next stage of the process.

As sliders in their operative positions leave the exit point, their actuating pins will travel along a reverse or return cam surface 158 which is curved in the opposite direction to the cam surface 156 so as to urge the sliders back into the inoperative position ready to receive another component when they again arrive at the pick up point. Thus the sliders at successive insertion stations reciprocate continuously back and forth as the drum rotates and allow components to be picked up successively at a relatively high rate and to be progressively inserted in successive wire loops. The operation is relatively smooth and continuous, limiting vibration which could otherwise cause some of the components to fall out of the wire loops prior to the soldering stage.

Although the rotatable assembly of the component insertion tool is described above as comprising a circular drum, the outer periphery of the drum need not be circular but could define any closed path for the component insertion stations carried on the drum, for example oval or elongate. The assembly need not be a drum but could comprise a conveyer belt or continuous chain type of track which may be linear or substantially linear between the pick up point and exit point, with the assembly preferably curving away from the workpiece path at the exit point to return empty component insertion stations to the pick up point.

From the component insertion stage the carrier strip carrying loops of wire with inserted components is directed to the soldering stage 30, which will not be described in great detail since it is of a generally conventional nature. As indicated in FIG. 1, the soldering stage includes fluxer 32 and a pre-heater 168 where the components are preheated to prevent damage from thermal shock. The pre-heater is arranged to be moved away from the wire loops and components automatically whenever the machine stops, to prevent damage to a component within the pre-heater for an excessive amount of time. The pre-heater comprises a heated piece of metal, similar to a soldering iron, having a slit through which the component passes. The pre-heater temperature is adjustable.

From the preheater, the loops and carried components pass through a wave soldering device 34. Each chip-loop assembly kisses the solder wave and picks up liquid solder by adhesion. As the solder freezes or cools the leads contacting the opposite sides of the chip or component are secured to the component.

Figures 16, 17:
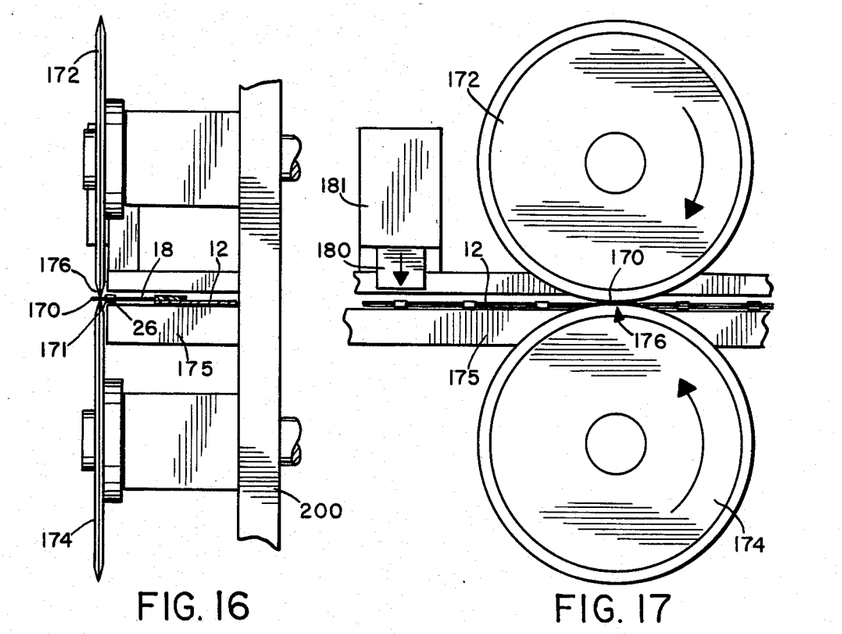
FIG. 16 is a side elevation view of the lead loop cut off stage.
FIG. 17 is a rear elevation view of the structure of FIG. 16.

After the soldering stage the carrier strip 12 is directed through a cutting stage 36, shown in more detail in FIGS. 16 and 17. The component leaving the soldering stage still has a loop end 170 projecting beyond its outer edge, as seen in FIG. 2, and thus the opposite leads 164 are short circuited. At the cutting stage the projecting loop end 170 is cut off to separate the leads.

The cutting stage 36 basically comprises a pair of circular knife blades 172, 174 rotating in opposite directions with their bladed edges in contact at contact point 176, as shown in FIG. 16. The carrier strip is guided in a linear path along a suitable guide 175 so that the projecting loop ends 170 of the component-loop assemblies are directed between the knife blades with the bladed edges contacting just beyond the outer edge 178 of the component. Thus the projecting loop will pass between the knife blades and be cut off. Since the knife blades cannot overlap there is a risk that loops will not be completely cut off at this point, so a further blade 180 is provided beyond the circular blades which is pushed downwardly in the direction of the arrow in FIG. 17 by a suitable actuator 181 as each component passes it to push off any remaining projecting loops.

Figure 18:
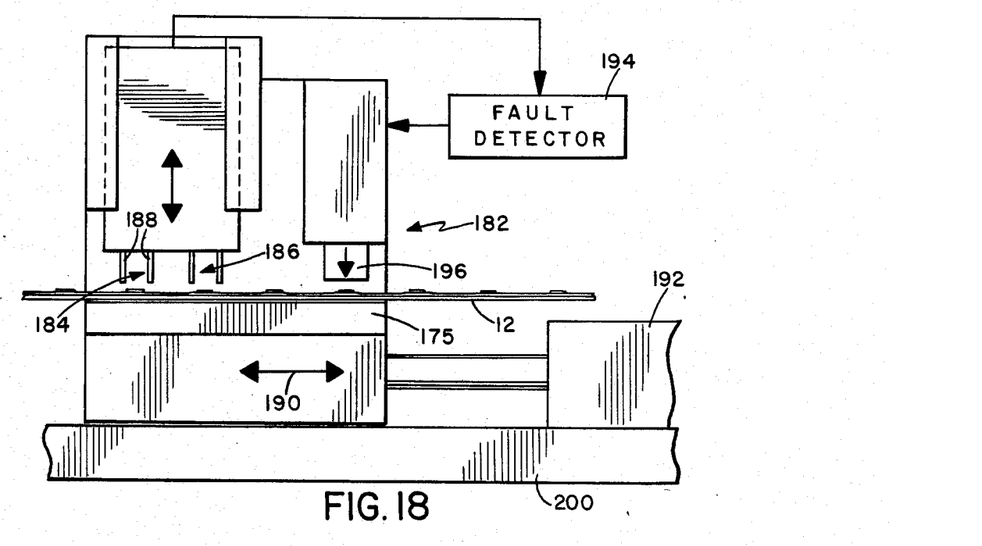
FIG. 18 is a front elevation view of a component testing stage of the machine.

An optional testing stage 182, illustrated in FIG. 18, is provided following the cutting stage for gross testing of components for open and short circuits. Besides the wire feeder, this is the only part of the machine which operates intermittently. As shown in FIG. 18, the testing stage comprises two test devices 184 and 186 which simultaneously test two successive components as they travel through the testing stage. The testing stage or station is driven back and forth in the direction of the arrow 190 in FIG. 18 to test successive pairs of components without stopping the carrier strip 12. A hydraulic actuator 192, for example, may be used to drive the testing station back and forth.

The test devices comprise spaced contacts 188 which contact the opposite leads of the components under test and provide output signals to a fault detector 194 which detects any open or short circuit in either of the tested components. After testing the test devices are lifted away from the components and the testing station is driven in the reverse direction until the next two components lie beneath the test devices. At this point the first of the two previously tested components will lie beneath cutter device 196 which will be actuated to cut off the underlying component if it was found by the fault detector to be faulty. If the second of the two tested components was faulty, it will be cut off in the next cycle of the testing station. Alternatively, the cutter device may be arranged to overlie both tested components simultaneously and to cut off either or both of the components according to control signals received from the fault detector. Thus any bad components will be automatically chopped off the carrier strip.

At this point the carrier strip carring finished components will be tensioned and wound on a suitable take up reel. Thus the machine incorporating continuously operating tools having a plurality of workpiece handling stations allowing continuous wire forming and component insertion operations can produce assemblied electronic components at a relatively higg rate and with reduced rates of faulty or unassembled components, for example as a result of components shaking loose prior to soldering to the wire leads. A machine according to this invention has been run at speeds of at least 200 components per minute at ½ inch spacings on the carrier strip and has achieved production rates of up to 300 finished components per minute with no problems.

In a modification, the closed end of the shaped loops of wire may be cut off prior to the component insertion stage, instead of after the soldering stage. Components can then be inserted into the narrow space between the projecting wire ends such that their outer edges slightly beyond the wire ends, ensuring that there are no projecting wire ends in the finished product.

The various rotating parts at various stages in the process are all rotated by suitable drive assemblies, which are not shown in the drawings for reasons of clarity.

The machine therefore provides a relatively high speed and reliability of component production, and because of the continuously operable tools takes up relatively little shop floor space as compared to manual or other non continuous lead assembly production processes.

Although the machine described above and the continuously operable tools have been described for use in manufacturing components with generally retangular dimensions having parallel projecting leads, they may also be used in other applications involving wire forming, for example, either in the assembly of leads to electronic components of other shapes or in wire forming for other purposes. For example, the wires may be shaped to have a cross over between which the opposed radial faces of disc-type components are retained.

Although some preferred embodiments of the present invention have been described above by way of example, it will be understood by those skilled in the field that modifications may be made to the disclosed embodiments without departing from the scope of the invention, which is defined by the appended claims.

What is claimed is:

1. A continuously operable tool for handling a plurality of workpieces simultaneously, comprising:
 a rotatable assembly;
 a series of workpiece handling stations spaced around the periphery of the assembly;
 workpiece feed means for feeding workpieces one by one to a pick-up point in the path of rotation of the periphery of the assembly;
 at least one workpiece handling device associated with each station, each workpiece handling device including pickup means for picking up a workpiece as said handling device passes the pick up point during rotation of the assembly and for carrying the picked up workpiece around with the assembly to an exit point spaced around the periphery of the assembly from the pick up point;
 means for transporting workpieces away from the rotatable assembly at the exit point; and
 actuating means for reciprocating each workpiece handling device back and forth as the assembly rotates between an inoperative position and an operative position in which it operatively engages a workpiece at the respective handling station between the pick up point and the exit point.

2. The tool as claimed in claim 1, wherein at least part of the path of rotation of each workpiece handling station between the pick-up point and exit point is curved.

3. The tool as claimed in claim 2, wherein the rotatable assembly comprises a drum and the workpiece handling stations are provided at spaced intervals around the outer periphery of the drum.

4. The tool as claimed in claim 3, wherein the pick up point is positioned approximately at the uppermost position of the drum.

5. The tool as claimed in claim 3, wherein the actuating means comprises at least one stationary cam surface positioned relative to the drum to cooperate with said handling devices to urge said handling devices between the inoperative and operative positions as the drum rotates.

6. The tool as claimed in claim 3, including means for transporting a continuous carrier means for carrying spaced workpieces around with the drum at least between the pick up point and the exit point.

7. The tool as claimed in claim 6, wherein said means for transporting picked up workpieces away from the drum comprises means for directing said continuous carrier means away from the surface of the drum at said exit point.

8. The tool as claimed in claim 6, wherein said means for transporting a continuous carrier means around with the drum comprises a series of spaced radially projecting indexing pins around the periphery of the drum for engaging in successive spaced indexing holes in the carrier means around at least a portion of the periphery of the drum.

9. The tool as claimed in claim 3, wherein the workpiece handling device at each station comprisese a slider for sliding axially across the surface of the drum.

10. The tool as claimed in claim 9, wherein the slider has a shaped cut-out comprising a forming die, each workpiece handling station comprising a wire forming station and further including a radially projecting anvil device for cooperating with the forming die in its operative position to bend a length of cut wire trapped between the opposed surfaces of the forming die and anvil device into a predetermined shape.

11. The tool as claimed in claim 10, wherein the workpiece feeding means comprises a wire feeding means for feeding cut lengths of wire at predetermined intervals into successive forming stations as they reach the pick up point.

12. The tool as claimed in claim 11, wherein the slider in its inoperative position is axially spaced from the anvil device to define a gap comprising said pick-up means, said wire feeding means comprising means for directing cut lengths of wire successively transversely into said gaps in successive forming stations as they pass said pick-up point.

13. The tool as claimed in claim 12, wherein said actuating means comprises stationary cam means for urging said slider towards said operative position between said pick-up point and said exit point, said anvil device being located in said cut out when said slider is in its operative position.

14. The tool as claimed in claim 13, further including actuating means for urging said anvil device between an inoperative position in which it is within the periphery of the drum and an operative position in which it projects radially from the surface of the drum, the further actuating means comprising a stationary cam means within said drum for co-operating with said anvil device to urge it into its operative position just before said pick-up point is reached.

15. The tool as claimed in claim 10, wherein said forming die cut-out and anvil device are of corresponding outline to form a length of cut wire into a symmetrical loop having parallel spaced free ends.

16. The tool as claimed in claim 15, wherein said cut-out and anvil device are of corresponding stepped outline to form a wire loop having a narrower inner end portion.

17. The tool as claimed in claim 15, including means for transporting a carrier strip around with the drum adjacent the forming stations between the pick-up point and exit point with an edge portion of the strip underlying the free ends of formed loops of wire, and securing means for securing the free ends of the formed loops to the carrier strip prior to the exit point, the means for transporting picked up lengths of wire away from the drum comprising means for directing the carrier strip and secured loops away from the drum at the exit point.

18. The tool as claimed in claim 17, wherein the securing means comprises means for applying adhesive tape to the edge portion of the strip and overlying free ends of the formed loops after the forming die reaches its operative position.

19. The tool as claimed in claim 18, wherein the securing means comprises a supply of adhesive tape, means for feeding the adhesive tape to the drum with its adhesive face facing the drum and means for pressing the adhesive tape against the edge portion of the drum and free ends of the wire loops.

20. The tool as claimed in claim 10, wherein the pick-up point is approximately at the uppermost position on the drum and the exit point is at the lowermost position of the drum, and the actuating means comprises a stationary cam surface extending adjacent the peripheral edge of the drum and cooperating means on said sliders for engaging said cam surface, said cam surface including a first advance portion curved towards the drum between its uppermost point and a three o'clock position to urge sliders travelling between the uppermost and three o'clock position into their operative positions, said cam surface further including a return portion curved in the opposite direction to said advance portion for engaging said co-operating means to urge said sliders back into their inoperative positions before they reach the lowermost position of the drum.

21. The tool as claimed in claim 1, wherein said workpiece handling stations comprise component insertion stations and said manipulating devices comprise means for inserting components between opposed arms of wire carried on a carrier strip, each manipulating device comprising a slider member having a pocket comprising said pick up means, said pocket opening upwardly for receiving a component, and said feed means comprises a component feed device for feeding components one by one into said pockets in successive slider members as they pass the pick up point.

22. The tool as claimed in claim 21, wherein said rotatable assembly comprises a drum, said drum having a series of spaced axial grooves around its periphery, and said slider members being slidably mounted in respective axial grooves.

23. The tool as claimed in claim 22, wherein said pockets are open sided and said slider members are narrower in width than the components, the drum having indexing means for carrying a carrier strip around with the drum with wire loops projecting from one edge of the strip into successive axial grooves above said slider members, said means for transporting workpieces away from the drum comprising means for directing said carrier strip away from the drum at said exit point, the height of said pockets being less than the height of said components, said actuating means comprising stationary cam means for urging said slider members axially across their respective grooves towards the closed end of the respective overlying wire loop until the carried component is gripped between opposite arms of the wire loop at its closed end.

24. A continuous wire lead forming and component assembly process, comprising the steps of:

supplying a continuous length of carrier strip and transporting it along a predetermined path between successive stages in the process;

directing the carrier strip around part of the path of the periphery of a rotating assembly between a pick up point and an exit point of the peripheral path of the assembly;

supplying successive lengths of cut wire at predetermined intervals to successive spaced wire forming stations carried on the periphery of the rotating assembly as they pass the pick up point;

bending the lengths of wire to form loops of a predetermined shape at each wire forming station as it travels between the pick up point and the exit point;

securing the formed wire loops to the carrier strip before it reaches the exit point;

directing the carrier strip and secured wire loops away from the rotating assembly at the exit point;

inserting a component between the opposed arms of each wire loop; and securing the inserted components to the respective loop.

25. The process as claimed in claim 24, wherein the step of securing the wire loops to the carrier strip comprises securing the free ends of each loop to the strip such that the closed end projects to one side of the strip, the process further including the step of cutting off the closed end of the loop projecting beyond the secured component.

26. The process as claimed in claim 25, wherein the step of inserting a component in the closed end of each wire loop comprises:

directing the carrier strip carrying spaced wire loops around part of the peripheray of a rotating drum so that each loop projects into a respective one of a series of spaced axial grooves in the peripheral surface of the drum;

feeding components one by one into pockets in slider members located in successive axial grooves beneath the wire loops so that the components project upwardly out of the pockets and between the opposite arms of the respective wire loop;

sliding each slider member axially across the respective groove towards the closed end of the loop until the carried component is gripped between the opposite arms of the loop; and directing the carrier strip with the carried wire loops and gripped components away from the drum.

27. The process as claimed in claim 25, wherein the step of cutting off the closed end of the loop occurs prior to the component insertion step, the component insertion step comprising inserting a component between the opposed arms remaining of the wire loops until the outer edges of the component projects slightly beyond the outer ends of the opposed arms.

28. A machine for securing wire leads to electronic components, comprising:

a supply of carrier strip at an input end of the machine;

a take up reel at an exit end of the machine;

means for transporting a continuous length of carrier strip along a predetermined path from the supply to the take up reel;

a wire forming tool at a first stage in the predetermined path, comprising a rotatable assembly having a series of wire forming stations spaced around its outer periphery, part of the outer periphery of the rotatable assembly lying in said predetermined path between a pick up point and an exit point, means for continuously rotating said assembly, feed means for feeding successive cut lengths of wire into said forming stations as they pass said pick up point, at least one wire bending die located at each forming station for bending a length of wire at that station into a predetermined shape, actuating means for reciprocating each wire bending die between an inoperative position and an operative position in which it bends a length of wire as it travels between said pickup point and said exit point, and means for securing bent lengths of wire to the carrier strip prior to the exit point;

a component insertion tool in said predetermined path subsequent to said wire forming tool, the component insertion tool comprising a rotatable assembly having a series of insertion stations spaced around its outer periphery, at least part of the path of rotation of the outer periphery of the insertion tool lying in said predetermined path between a pick up point and an exit point, a component feed means for feeding components one by one into said insertion stations as they pass said pick up point, means for locating said bent lengths of wire in successive insertion stations prior to said pick up point, and means for urging a component in a respective station between the opposed arms of a bent length of wire at that station until it is retained between the opposite arms of the bent length of wire; and means for securing the components to the opposite arms of the respective bent lengths of wire.

* * * * *